(12) United States Patent
Fujino et al.

(10) Patent No.: US 6,303,670 B1
(45) Date of Patent: Oct. 16, 2001

(54) CELLULOSE BASED COATING COMPOSITION CURABLE WITH ULTRAVIOLET RAY

(75) Inventors: Kenichi Fujino, Iwakuni (JP); Shelby F. Thames, Hattiesburg, MS (US)

(73) Assignee: Nippon Paper Industries Co., Ltd., Tokyo (JP)

( * ) Notice: Subject to any disclaimer, the term of this patent is extended or adjusted under 35 U.S.C. 154(b) by 0 days.

(21) Appl. No.: 09/513,079

(22) Filed: Feb. 25, 2000

(51) Int. Cl.[7] .................................................... C08F 2/48
(52) U.S. Cl. ...................... 522/88; 522/100; 522/103; 522/101; 522/168; 522/170; 527/315; 527/300
(58) Field of Search .............................. 522/88, 100, 101, 522/103, 122, 168, 170; 527/300, 315

(56) References Cited

U.S. PATENT DOCUMENTS

| | | |
|---|---|---|
| 3,386,932 | 6/1968 | Steinmann . |
| 4,151,056 | * 4/1979 | Park ..................................... 522/100 |
| 4,170,663 | * 10/1979 | Hahn et al. ............................ 427/44 |
| 4,318,776 | * 3/1982 | Smith ................................... 156/330 |
| 4,975,300 | * 12/1990 | Deviny ................................. 427/54.1 |

FOREIGN PATENT DOCUMENTS

| | | |
|---|---|---|
| 60-135423 | 7/1985 | (JP) . |
| 05-186567 | 7/1993 | (JP) . |
| 07-268065 | 10/1995 | (JP) . |

OTHER PUBLICATIONS

S. Kim, et al., J. Macromol. Sci. A., vol. 10, No. 4, "Biodegradable Cellulose Block Copolymers", 1976 (Abstract only).

A. R. Amick, et al., Polymer, vol. 21, No. 6, "Preparation and Water Sorption Properties of Cellulose–Polypropylene Glycol Block Copoymers", 1980, (Abstract only).

* cited by examiner

Primary Examiner—James J. Seidleck
Assistant Examiner—Sanzei L. McClendon
(74) Attorney, Agent, or Firm—Oblon, Spivak, McClelland, Maier & Neustadt, P.C.

(57) ABSTRACT

Disclosed is an ultraviolet-curable cellulosic coating composition comprising cellulose acetate, diepoxy compound and photo cationic polymerization catalyst. The objective is to provide a novel ultraviolet-curable cellulosic coating composition capable of forming a film excellent in the adherence to polar substrate, solvent resistance, gloss and impact resistance.

4 Claims, No Drawings

CELLULOSE BASED COATING COMPOSITION CURABLE WITH ULTRAVIOLET RAY

BACKGROUND OF THE INVENTION

The present invention relates to a novel ultraviolet-curable cellulosic coating composition having excellent adherence to metals, woods, polar plastics, etc. and being capable of forming a film excellent also in the solvent resistance, gloss and impact resistance.

Since cellulose esters are not only derived from cellulose that is one of the recyclable natural resources as a starting raw material, but also capable of forming films excellent in the solvent resistance, gloss, impact resistance, etc., they are applied to paint and ink additives, moldings such as film, and in other wide fields. Moreover, aiming at additional high functionalization of these cellulose esters, many crosslinking reactions that utilize the hydroxyl groups remaining in cellulose ester and being rich in reactivity are known.

In order to achieve good solvent solubility, the degree of ester substitution of cellulose is usually designed as low as around 1, and, as a result, the number of hydroxyl groups in one molecule of cellulose esters is very high. For this reason, in most crosslinking reactions utilizing cellulose esters, the control of crosslinking density is difficult, leading to many problems in actual application.

In order to solve the problems aforementioned, a technology for controlling the number of hydroxyl groups in cellulose acetate to about 1 or 2 at the end of molecule, and further a modifying technology for utilizing these esters are reported in U.S. Pat. No. 3386932, Japanese Unexamined Patent Publication Nos. Sho 60-135423 and Hei 2-48012, R. Amick et al; Polymer, 21, 648 (1980), etc.

With these conventional technologies, however, there arise problems of causing gelation at the stage of modifying these esters through urethane reaction etc., and the like, since it is difficult to accurately control the number and the position of hydroxyl groups in one molecule of cellulose acetate. In addition, these cellulose acetates being near 3-substitution form hardly dissolve into the solvents used commonly, thus making these technologies not to be used widely.

While, in the field of UV-curing resins, a cationic UV-curing resin comprising a combination of epoxy resin, hydroxyl group-containing crosslinking agent and photo initiator is developed widely in recent years from advantages such as less influence of oxygen etc. over conventional radical-polymerizable UV-curing resins. With respect to the application of cellulose esters in this field, there are little actual results in use, and they were at a level of insignificant use as additives. This is because of that, since the common cellulose esters have many hydroxyl groups as described above, if the use level becomes high, the crosslinking density would become too high, resulting in decreased physical properties of film.

As a result of diligent investigations, the inventors have found that cellulose acetate with adjusted number of hydroxyl groups in it has excellent compatibility with particular epoxy compound, hence it forms a homogeneous mixture even without solvent, and further that an excellent film can be formed under UV irradiation by adding photo initiator to this mixture, leading to the invention based on these knowledges.

SUMMARY OF THE INVENTION

As described above, the invention provides following (1) (2) and (3).

(1) Ultraviolet-curable coating composition comprising 5 to 30 parts by weight of cellulose acetate (A) with number average molecular weight of 1,500~5,000 and average number of free hydroxyl groups in one molecule of 1~3, 70 to 95 parts by weight of diepoxy compound (B) and not less than 0.1 part to not more than 5 parts by weight of photo cationic polymerization catalyst (C).

(2) The ultraviolet-curable coating composition, wherein the diepoxy compound (B) of (1) consists of at least one or more of aliphatic epoxy compound, alicyclic epoxy compound and glycidyl ether derived from aliphatic alcohol.

(3) The ultraviolet-curable coating composition described in (1) and (2), wherein the cellulose acetate (A) is compatible with the diepoxy compound (B) to give a homogeneous mixture without solvent.

DETAILED DESCRIPTION OF THE INVENTION

The cellulose acetate (A) with number average molecular weight of 1,500~5,000 and average number of free hydroxyl groups in one molecule of 1~3 suitable as the cellulose acetate to be used in the invention can be prepared by publicly known methods (e.g. method described in U.S. Pat. No. 3,386,932 etc.), for example, by methods of hydrolyzing cellulose triacetate with a mixture of acetic acid, acetic anhydride, sulfuric acid and water in particular proportion, and the like.

In the number average molecular weight is under 1,500, then it is difficult to recover after hydrolysis and the film after UV irradiation becomes brittle as well. If the number average molecular weight is over 5,000, then it is difficult to control the number of free hydroxyl groups to 1–3 and the viscosity of mixture with epoxy compound also increases, which is unpreferable.

If the average number of free hydroxyl groups in one molecule is under 1, then sufficient crosslinking does not occur, resulting in decreased physical properties of film. Also, if over 3, the crosslinking density becomes too high, leading to decreased physical properties of film.

The number average molecular weight of cellulose acetate can be measured by publicly known methods such as GPC (gel permeation chromatography) and the average number of free hydroxyl groups in a molecule can be determined using hydroxyl value measured by titration methods, NMR, etc. and number average molecular weight.

As the diepoxy compounds (B) to be used in the invention, aliphatic epoxy compounds such as 1,2,3,4-diepoxybutane, 1,2,7,8-diepoxyoctane and 1,2,9,10-diepoxydecane, glycidyl ether-based epoxy compounds derived from aliphatic alcohols such as 1,4-butanediol glycidyl ether, 1,6-hexanediol glycidyl ether, polyethylene glycol glycidyl ether and polypropylene glycol glycidyl ether, alicyclic epoxy compounds such as vinylcyclohexene diepoxide, 1,2,5,6-diepoxycyclooctane, 3,4-epoxycyclohexylmethyl-3',4'-epoxycyclohyxane carboxylate and its derivatives can be mentioned. Epoxy compounds other than above, for example, bisphenol A-based glycidyl ethers cannot be used, because of poor compatibility with the cellulose acetate of the invention.

The use level by weight of cellulose acetate (A) to diepoxy compound (B) is 5:95 to 30:70. If the amount of cellulose acetate is under this range, then decreased physical properties such as brittles film can result and, if the amount of cellulose acetate is over this range, then the viscosity increases or the insolubles generate, which is unpreferable.

The photo cationic polymerization catalyst (C) to be used in the invention is one to initiate the curing reaction through cationic polymerization mechanism by the use of ultraviolet rays, and publicly known catalysts, for example, aromatic iodonium salts such as hexafluoroarsenic acid-bis (dodecylphenyl)iodonium and hexafluoroantimonic acid-bis (dodecylphenyl)iodonium, aromatic sulfonium salts, aromatic diazonium salts, etc. can be used.

The use level of said photo cationic polymerization catalyst (C) is within a range from not less than 0.1% by weight to not more than 5% by weight based on total amounts of cellulose acetate (A) and diepoxy compound (B). If under 0.1% by weight, then the curing time becomes long and, if over 5% by weight, then decreased physical properties such as yellowing can result, which is unpreferable.

The coating composition of the invention has excellent adherence to metals, woods, polar plastics, etc. and forms a film excellent also in the solvent resistance, gloss and impact resistance. Moreover, additives such as leveling agent, viscosity modifier, photo stabilizer, moisture absorber, pigment, dye and reinforcing agent can be added to the composition of the invention for use. The use level of these additives can be determined appropriately depending on the purpose.

In following, the invention will be illustrated in more detail based on examples, but the invention is not confined thereto.

EXAMPLE (Trial example-1)

Into a 2 L volume four-neck separable flask equipped with stirrer, thermometer and cooling pipe, 80 g of cellulose triacetate (weight average molecular weight 60,000, DS=2.95), 796.8 g of acetic acid and 13.2 g of acetic anhydride were charged. After mixed homogeneously at 80° C., 4.0 ml of concentrated sulfuric acid and 3.2 g of water were added and the reaction was conducted further for 24 hours at 80° C. After completed the reaction of adding 100 g of 38% aqueous solution of magnesium acetate, the reaction product was put into 5 L of water to obtain precipitates. After repeated the filtration and washing of precipitates thrice, they were dried to obtain a cellulose acetate with number average molecular weight of 2,900 and average number of free hydroxyl groups of 2.2.

The number average molecular weight was measured by means of GPC at flow rate of 1.0 ml/min, using chloroform for developing solvent, polystyrene for standard reagent and RI for detector.

(Example-1)

Two grams of cellulose acetate obtained in Trial example-1, 8 g of butanediol glycidyl ether (purity 60%, from Aldrich), 0.1 g of UVI-6974 (from Union Carbide) and 0.1 g of UVI-6990 (from Union Carbide) were stirred homogeneously. The composition obtained was coated onto a steel plate (Q-panel) using coating bar and UV was irradiated to obtain a film with film thickness of 20 μm. For UV irradiation, DRS-120 (from Fusion System) was used under conditions of speed of 50 rpm and 5 passes using mercury lump as a light source.

(Example-2)

One gram of cellulose acetate obtained in Trial example-1, 9 g of butanediol glycidyl ether, 1.4 g of 3,4-epoxycyclohyxylmethyl-3',4'-epoxycyclohexane carboxylate, 0.1 g of UVI-6974 (from Union Carbide). 0.1 g of UVI-6990 (from Union Carbide) and 0.1 g of Surfron S-393 (from Ashai Glass) were stirred homogeneously. A cured film with film thickness of 20 μm was obtained on a steel plate by the method similar to Example-1.

(Comparative example-1)

In place of the cellulose acetate used in Example-1, cellulose acetate with number average molecular weight of 30,000 and degree of acetylation of 39.8 wt. % (from Aldrich, average number of free hydroxyl groups 300) was used. A composition obtained by additionally adding 90 g of acetone as a diluent was coated onto a steel plate. After dried for 30 minutes at 80° C. in a blowing drier, UV irradiation was performed similarly to prepare a cured film, which was made to be Comparative example-1.

(Comparative example-2)

One tenth gram of cellulose acetate obtained in Trial example-1, 8 g of butanediol glycidyl ether, 1.9 g of 3,4-epoxycyclohexylmethyl-3',4'-epoxycyclohexane carboxylate, 0.1 g of UVI-6974 (from Union Carbide), 0.1 g of UVI-6990 (from Union Carbide) and 0.1 g of Surfron S-393 (from Asahi Glass) were stirred homogeneously. A cured film with film thickness of 20 μm was obtained on a steel plate by the method similar to Example-1.

Of the specimens obtained in Examples-1 and 2, and Comparative examples-1 and 2 aforementioned, following tests were performed. The results are shown in Table 1.

Adherence test (ASTM D3359)

MEK double rub test (ASTM D5402)

Gloss (60°, ASTM D1925)

In the measurement of gloss, white carton was used as a substrate in place of steel plate for measurement.

Impact resistance (ASTM D2794)

TABLE 1

| | Test results | | | |
|---|---|---|---|---|
| | Adherence test | MEK double rub test | Gloss (%) | Impact resistance (lb · in) Upper row: Direct Lower row: Reverse |
| Example-1 | 5B | Stand 250 times | 89.1 | 100 60 |
| -2 | 4B | Stand over 500 times | 92.7 | 80 40 |
| Comparative example-1 | 0B | Stand 120 times | 85.1 | 20 10 |
| -2 | 0B | Stand 50 times | 86.4 | 20 10 |

When cellulose acetate with high number of hydroxyl groups is used in Comparative example 1, or when amount of cellulose acetate is less in Comparative example 2, the cured film becomes hard and brittle in all cases, hence the physical properties in adherence test and impact resistance test decrease. While, in the examples, despite that hard cured films are obtained similarly, the impact resistance is excellent at the same time, showing additionally very good results also in the adherence, solvent resistance, gloss, etc. It can be said, therefore, that the inventive resin composition is useful.

What is claimed is:

1. An ultraviolet-curable cellulosic coating composition comprising (A) 5 to 30 parts by weight of cellulose acetate with number average molecular weight of 1,500~5,000 and average number of free hydroxyl groups in one molecule of 1~3, (B) 70 to 95 parts by weight of a diepoxy compound and (C) not less than 0.1 part to not more than 5 parts by weight of a photo cationic polymerization catalyst.

2. The ultraviolet-curable cellulosic coating composition of claim 1, wherein (A) the cellulose acetate is compatible with (B) the diepoxy compound to give homogeneous mixture without solvent.

3. The ultraviolet-curable cellulosic coating composition of claim 1 or 2, where (B) the diepoxy compound consists of at least one or more of aliphatic epoxy compound, alicyclic epoxy compound and glycidyl ether derived from aliphatic alcohol.

4. An ultraviolet-curable cellulosic coating composition, wherein (C) a photo cationic polymerization catalyst of 0.1~5 wt. % is added to a compatible and homogeneous mixture of 100 weight parts substantially consisting of (A) 5~30 weight parts of a cellulose acetate with number average molecular weight of 1,500~5,000 and average number of free hydroxyl groups in one molecule of 1~3, and (B) 70~95 weight parts of a diepoxy compound.

* * * * *

UNITED STATES PATENT AND TRADEMARK OFFICE
CERTIFICATE OF CORRECTION

PATENT NO. : 6,303,670 B1
DATED : October 16, 2001
INVENTOR(S) : Fujino et al.

Page 1 of 1

It is certified that error appears in the above-identified patent and that said Letters Patent is hereby corrected as shown below:

<u>Column 3,</u>
Line 35, delete "C.," and insert -- C, --

Signed and Sealed this

Twenty-first Day of May, 2002

Attest:

JAMES E. ROGAN
*Director of the United States Patent and Trademark Office*

*Attesting Officer*